United States Patent [19]
Jo

[11] Patent Number: 5,966,327
[45] Date of Patent: Oct. 12, 1999

[54] ON-OFF CURRENT RATIO IMPROVING CIRCUIT FOR FLAT-CELL ARRAY

[75] Inventor: Sung-Wook Jo, Daejon, Rep. of Korea

[73] Assignee: LG Semicon Co., Ltd., Cheongju, Rep. of Korea

[21] Appl. No.: 09/014,405

[22] Filed: Jan. 28, 1998

[30] Foreign Application Priority Data

Feb. 26, 1997 [KR] Rep. of Korea .......................... 97/5888

[51] Int. Cl.$^6$ ..................................................... G11C 16/04
[52] U.S. Cl. ................................ 365/185.11; 365/185.16; 365/230.03
[58] Field of Search ...................... 365/51, 104, 185.16, 365/185.11, 230.03

[56] References Cited

U.S. PATENT DOCUMENTS

| | | | |
|---|---|---|---|
| 5,117,389 | 5/1992 | Yiu | 365/104 |
| 5,517,448 | 5/1996 | Liu | 365/185.11 |
| 5,600,586 | 2/1997 | Lee | 365/104 |

Primary Examiner—David Nelms
Assistant Examiner—David Lam
Attorney, Agent, or Firm—Fleshner & Kim

[57] ABSTRACT

An on/off current ratio improving circuit for a flat-cell array which is capable of maintaining an insulation state between unit memory cells by configuring the unit memory cells by using a predetermined number of cells, disposing a metal bit line at left and right sides of the unit memory cell, disposing a ground terminal fixed to the center of the circuit, and connecting to an external ground terminal of the memory cell. The circuit includes a metal line connection unit for selectively connecting an external ground unit between left and right metal bit lines, an inner and outer cell selection unit for selecting a cell connected to the metal line connection unit in accordance with a signal transmitted to inner and outer selection lines among unit cells of a cell array, which cells are symmetrically disposed about a fixed ground terminal, left and right selection units for selecting a left cell or right cell connected between the metal line connection unit and the fixed ground terminal in accordance with a signal transmitted to the left and right selection lines among the unit cells of the cell array, and a memory unit which is disposed by the unit group having a predetermined number of cells for driving a cell of a corresponding unit group in accordance with driving of word lines.

18 Claims, 16 Drawing Sheets

ON-OFF CURRENT RATIO IMPROVING CIRCUIT FOR FLAT-CELL ARRAY

BACKGROUND OF THE INVENTION

1. Field of the Invention

The present invention relates to accessing a flat-cell ROM integrated device, and in particular to an improved on/off current ratio improving circuit for the flat-cell array which is capable of increasing an on/off current ratio of a cell which is used for reading a data by removing parasitic capacitance which occurs when selecting and reading a data from a memory cell.

2. Description of the Conventional Art

FIG. 1 illustrates a conventional flat-cell array which includes a virtual ground, which circuit was disclosed in U.S. Pat. No. 5,117,389 (Jun. 26, 1992).

As shown therein, the conventional flat-cell array includes a connection unit 11 for selectively connecting an external ground terminal GND to an internal cell array 12 through a metal line. In the internal cell array 12, a plurality of cells are connected in a matrix form for outputting data through a corresponding cell in accordance with a driving operation of word lines WL[0]–WL[N], and cell selection units 13L and 13R for selecting a corresponding cell by using left and right selection lines L_SL and R_SL and a plurality of past transistors among two cells connected to a metal bit line MBL and a virtual ground line VGML when a group of cells is selected in accordance with a driving operation of poly word lines WL[0]–WL[n].

The connection unit 11 is provided with a plurality of metal contacts MC0–MC3, and connects a corresponding local bit line and a virtual ground line VGML[N-1], a corresponding local bit line and a metal bit line MBL[N-1], a corresponding local bit line and a virtual ground line VGML[N], and a local bit line and a metal bit line MBL[N], respectively, among a plurality of local bit lines LBL.

The cell array 12 is provided with a plurality of cells $(NM_{1.1}-NM_{1.8})$-$(NM_{n.1}-NM_{n.8})$, each driven by the corresponding word lines WL[0]–WL[N], and each of the local bit lines LBL is connected with each corresponding connecting point of the plurality of cells $(NM_{1.1}-NM_{1.8})$-$(NM_{N.1}-NM_{N.8})$.

The cell selection unit 13R is provided with a plurality of pass NMOS transistors $(NM_{R.1}-NM_{R.4})$ which connect each of even number cells and each of the corresponding local bit lines LBL, when the right selection line R-SL is driven, so that odd number cells are selected among the plurality of cells $(NM_{1.1}-NM_{1.8})$-$(NM_{N.1}-NM_{N.8})$.

The cell selection unit 13L is provided with a plurality of pass NMOS transistors $(NM_{L.1}-NM_{L.4})$ which connect each of odd number cells and each of the corresponding local bit lines LBL, when the left selection line L-SL is driven, so that even number cells are selected among the plurality of cells $(NM_{1.1}-NM_{1.8})$-$(NM_{N.1}-NM_{N.8})$.

With reference to FIGS. 2 and 4, the operation of the conventional memory cell array will be described.

The virtual ground line VGML and metal bit line MBL, which are externally and selectively connected, are vertically formed with respect to the poly word line WL. The virtual ground line VGML and the metal bit line MBL are alternately connected to each other.

When one cell is selected from a plurality of cells of the cell array 12, and the data written in the cell is read, one neighboring virtual ground line VGML and one metal bit line MBL are selected, and the remaining virtual ground lines VGML and metal bit lines MBL become an open state (or a floating state). In addition, one word line of the multiple word lines WL[0]–WL[N] is driven, and a cell of a predetermined cell group is selected. Two cells are selected in accordance with the selection of the virtual ground line VGML and the metal bit line MBL, and one cell between the two cells is selected in accordance with a driving operation of the left and right selection lines L_SL and R_SL.

FIG. 2A illustrates a current flow path when a predetermined cell $MN_{n.4}$ is selected from the circuit of FIG. 1. One WL[N] of the word lines WL[0]–WL[N] is driven, and the virtual ground line VGML[N] and the metal bit line MBL[N-1] are selected, and two cells $MN_{n.4}$ and $NM_{n.5}$ are selected, and a high level current is supplied to the left selection line L_SL between the left and right selection lines L_SL and R_SL, for thus finally selecting a corresponding cell $MN_{n.4}$. Therefore, the current flow path is formed as follows: The metal bit line MBL[N-1]→ the metal contact MC1→ the local bit line LBL1→ the cell $MN_{n.4}$ →the local bit line LBL2→ the pass NMOS transistor $NM_{L.3}$→ the local bit line LBL3→ the metal contact MC2→ the virtual ground line VGML[N].

Taking another example, FIG. 2B illustrates another current flow path when a predetermined cell which is a cell $NM_{n.5}$ is selected from the circuit of FIG. 1.

As shown therein, differently from FIG. 2A, a high level current is supplied to the right selection line R_SL. The other operations are identical to FIG. 2A. Therefore, the current flow path is as follows: The metal bit line MBL[N-1]→ the metal contact MC1→ the local bit line LBL1→ the pass NMOS transistor $NM_{R.2}$→ the local bit line LBL2→ the cell $NM_{n.5}$→ the local bit line LBL3→ the metal contact MC2→ the virtual ground line VGML[N].

The actual current flow path of the cell is not formed as shown in FIGS. 2A and 2B due to parasitic capacitance which exists in the metal bit line MBL and the virtual ground line VGML, remaining as the open state, but variably formed as shown in FIGS. 3a and 3b.

First, with reference to FIG. 3A, the reason of the increase of the off current caused by the parasitic current flow path will be explained.

The metal bit line MBL[N-1], the virtual ground line VGML[N], and the word line WL[N] are selected, and then the left selection line L_SL is selected, and the cell $NM_{R.4}$ is finally selected. At this time, when a low level data is sequentially written into the cells $NM_{N.2}$ and $NM_{N.3}$ neighboring with the cell NMN.4, the parasitic capacitance CO formed at the virtual ground line VGML[N-1], which is not selected, is connected to the selected metal bit line MBL[N-1] and the virtual ground line VGML[N], respectively.

If the parasitic capacitance CO has been discharged, and a high level data is written into the selected cell $NM_{n.4}$, the off current of the cell $NM_{n.4}$ used for reading the high level data is not flown through the ideal current flow path, but is flown through a parasitic current path PCP1 along the external ground terminal GND formed by the discharged parasitic capacitance CO.

Since the current path of the ideal off current the cell $NM_{n.4}$ is blocked due to the high level data of the cell $NM_{n.4}$ the current becomes zero as shown by the waveform CUR1 of FIG. 4A. However, the operation that the low level data of another cell except for the cell $NM_{n.4}$ selected by the parasitic current path PCP1 is read is performed. The amount of the current passing through the metal bit line MBL[N-1], namely the off current is increased as shown by the waveform CUR2 of FIG. 4A.

In addition, the causes of the decrease of the on current due to the parasitic current path will now be explained with reference to FIG. 3B.

The cell $NM_{n,3}$ is selected during the selection step as shown in FIG. 3A. When the low level data is sequentially written into the cells $NM_{n,4}$ and $NM_{n,5}$, respectively, neighboring with the cell $NM_{n,3}$, a parasitic capacitance C2 formed in the virtual ground line VGML[N-1] which is not selected is connected to the metal bit line NBL[N-1] and the virtual ground line VGML[N-1], respectively.

At this time, when the parasitic capacitance C2 has been charged, and the low level data is written into the selected cell $NM_{n,3}$, the on current of the cell $NM_{n,3}$ used for reading the low level data does not maintain a normal value as shown by the waveform CUR3 of FIG. 4B by the parasitic capacitance C2, except for the normal current path. Namely, the on current is decreased as shown by the waveform CUR4.

In the case of the ideal on current, the voltage level at the node N1 becomes almost zero when connecting an external ground terminal GND to the cell $NM_{n,3}$ through the virtual ground line VGML[N]. However, the voltage at the node N1 is increased by the voltage charged into the parasitic capacitance C2. When the voltage charged into the parasitic capacitance C2 is discharged, the voltage is charged again by the parasitic current path PCP2, thus the voltage at the node N1 is maintained at a constant level. The voltage difference between the selected cell $NM_{n,3}$ and the node N1 is decreased, and the on current flowing at the metal bit line MBL[N-1] is decreased.

In other words, in order to selectively connect the external ground terminal GND of an external memory cell to the node N1, the pass transistor, namely, the NMOS transistors $NM_{R,1}$, $NM_{R,2}$, $NM_{L,2}$, and $NM_{L,3}$ must be connected at the terminal of the virtual ground line VGML[N]. Therefore, the node N1 can not have the voltage identical to the external ground terminal GND.

Finally, the on current of the selected cell is decreased, the off current is increased, and the on/off current ratio of the cell is decreased. The capacity of the memory cell is increased due to the decreased on/off current ratio, for thus increasing the parasitic capacitance.

As described above, in the cell array of the conventional flat-cell ROM integration device, a virtual ground line is necessarily used for selectively connecting an external ground terminal GND to the cell array. Since the cells connected to the word lines are connected in series, when the low level data of the cells are sequentially outputted, the parasitic capacitance of the virtual ground line is connected to the metal bit line which is selected together with the parasitic capacitance of the metal bit lines which not selected, for thus decreasing the on/off current ratio. In the memory apparatus which is configured to read the data of the cell based on the difference between the on current and the off current, the decrease of the on/off current causes a sensing time delay, so that the conventional flat-cell array can not be adapted to the low electric power flat-cell memory in which the current of the cell is significantly decreased and the flat-cell memory which requires a high speed sensing time.

SUMMARY OF THE INVENTION

Accordingly, it is an object of the present invention to provide an on/off current ratio improving circuit for a flat-cell array which overcomes the aforementioned problems encountered in the conventional art.

It is another object of the present invention to provide an on/off current ratio improving circuit for a flat-cell array which is capable of maintaining an insulation state between each unit memory cells by configuring the unit memory cells with a predetermined number of cells, providing a metal bit line at left and right sides of each the unit memory cells, and providing a ground terminal which is provided in the center of the circuit and connected to an external ground terminal of the memory cell.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 5:
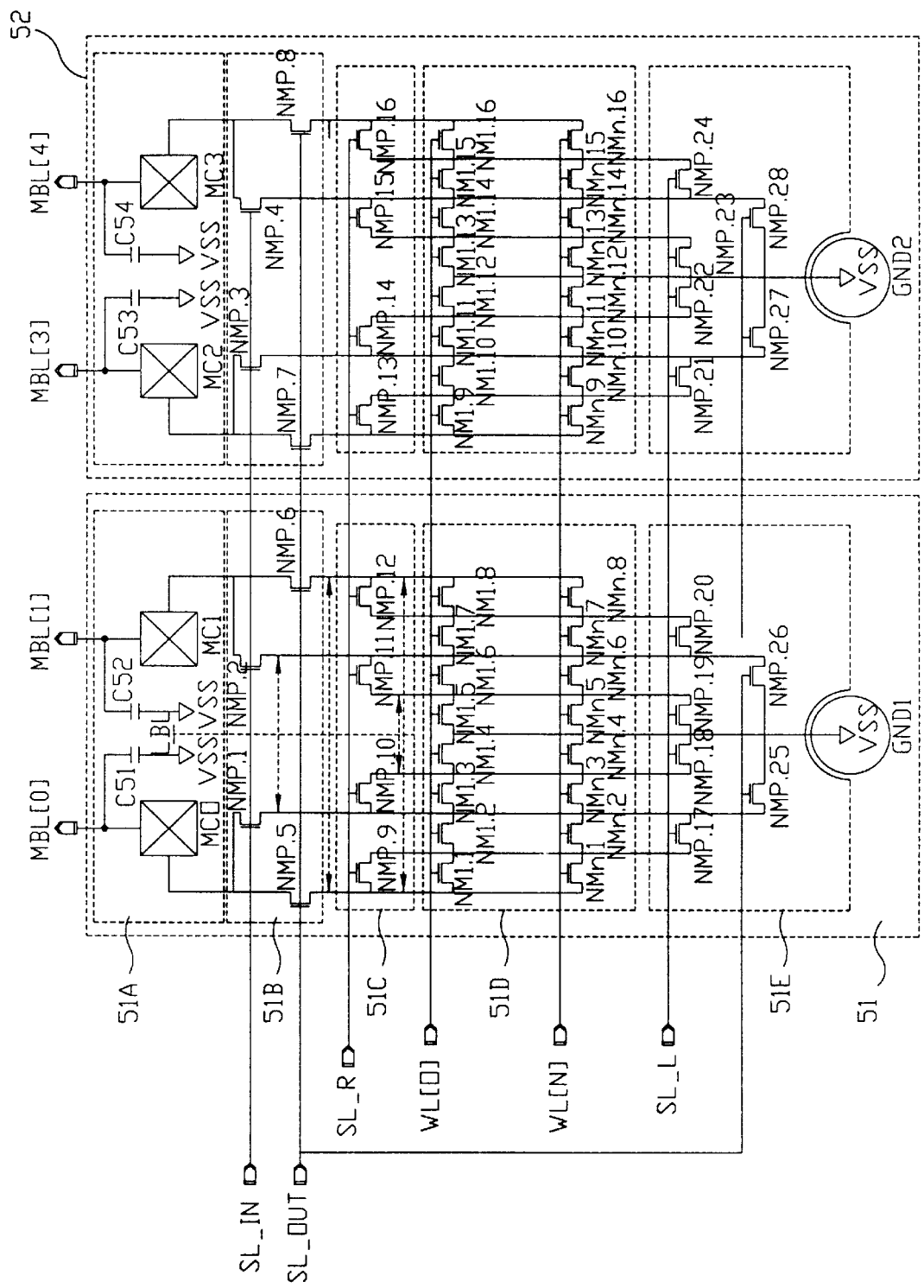
FIG. 5 is a circuit diagram illustrating an on/off current ratio improving circuit for a flat-cell array according to the present invention.

FIG. 5 illustrates an on/off current ratio improving circuit for a flat-cell array according to the present invention.

As shown therein, the on/off current ratio improving circuit for a flat-cell according to the present invention includes a metal line connection unit 51A for selectively connecting an external ground terminal GND to left and right metal bit lines MBL[0] and MBL[1], an inner and outer cell selection unit 51B for selecting a corresponding cell in accordance with the signal transmitted to inner and outer selection lines SL__IN and SL__OUT among unit cells of a cell array 51D, which are symmetrically connected centering around a fixed ground terminal GND1, a right cell selection unit 51C for selecting a corresponding right cell in accordance with the signal transmitted to the right selection line SL__R among the unit cells of the cell array 51D, a cell array 51D in which a plurality of cells are arranged in a matrix form for outputting the data of a corresponding cell in accordance with the driving of the word lines WL[0]–WL[N], and a left cell selection unit 51 E for selecting a left cell in accordance with the signal transmitted to the left selection line SL__L among the unit cells of the cell array 51D, a memory unit 51 which is provided with said units 51A–51E, and a plurality of sub-memory units 52 dependently connected to the memory units 51 and having the same construction as the memory unit 51.

The metal line connection unit 51A is provided with metal contacts MC0 and MC1, thus respectively connecting the metal bit lines MBL[0] and MBL[1] to each corresponding local bit in the memory unit 51.

The inner and outer cell selection unit 51B is provided with NMOS transistors $NM_{P.1}$ and $NM_{P.2}$ driven by a driving signal of the inner selection line SL__IN, and NMOS transistors $NM_{P.5}$ and $NM_{P.6}$ driven by a driving signal of the outer selection line SL__OUT, thereby being able to select a pair of cells among a plurality of cells $(NM_{1.1}-NM_{1.8})-(NM_{n.1}-NM_{n.8})$ in the cell array 51D. The right cell selection unit 51C includes NMOS transistors $NM_{P.9}-NM_{P.12}$ driven by a driving signal of the right selection line SL__R and selects a right cell between a pair of cells selected by the inner and outer cell selection unit 51B.

The cell array 51D includes the plurality of cells $(NM_{1.1}-NM_{1.8})-(NM_{n.1}-NM_{n.8})$ arranged in a matrix form and outputs a data of a corresponding cell in accordance with a driving operation of the word lines WL[0]–WL[N].

The left cell selection 51E is provided with NMOS transistors $NM_{P.17}-NM_{P.20}$ driven by a driving signal of the left selection line SL__L and thus selects a left cell between a pair of cells selected by the inner and outer cell selection unit 51B and NMOS transistors $NM_{P.25}$ and $NM_{P.26}$ driven by a driving signal of the outer selection line SL__OUT, thereby lastly connecting a selected cell to a fixed ground terminal GND1.

The operation of effects of the on/off current ratio improving circuit for a flat-cell array according to the present invention will now be explained with reference to FIGS. 6 through 9.

FIG. 5 illustrates a unit block composed of eight cells. The step of selecting a cell $NM_{n.1}$ from the memory unit 51 will now be explained with reference to FIG. 6.

First, a high level signal is applied to the word line WL[N], memory cells $NM_{n.1}-NM_{n.8}$ of which gates are commonly connected to the word line WL[N], are selected. Thereafter, the metal bit line MBL[0] is externally selected and is connected to the external ground terminal. In addition, the high level signal is transmitted to the outer selection line SL__OUT, and the pass NMOS transistors $NP_{P.5}$ and $NP_{P.25}$ are turned on, for thus selecting two cells $NM_{n.1}$ and $NM_{n.2}$ among the memory cells $NM_{n.1}-NM_{n.8}$. At this time, the inner selection line SL__IN has a low level value, which is reverse to the value at the outer selection line SL__OUT.

Finally, since the high level data is supplied to the left selection line SL__L, and the pass NMOS transistor $NM_{P.17}$ is turned on, the cell $NM_{n.1}$ is selected between two cells $NM_{n.1}$ and $NM_{n.2}$. Namely, the metal bit line MBL[0] is connected to the fixed ground terminal GND1 through the NMOS transistor $NM_{P.5}$, the local bit line LBL[0], the cell $NM_{n.1}$, the local bit line LBL[1], the NMOS transistor $NM_{P.17}$, the local bit line LBL[2], and the NMOS transistor $NM_{P.25}$, respectively.

Figure 7A:
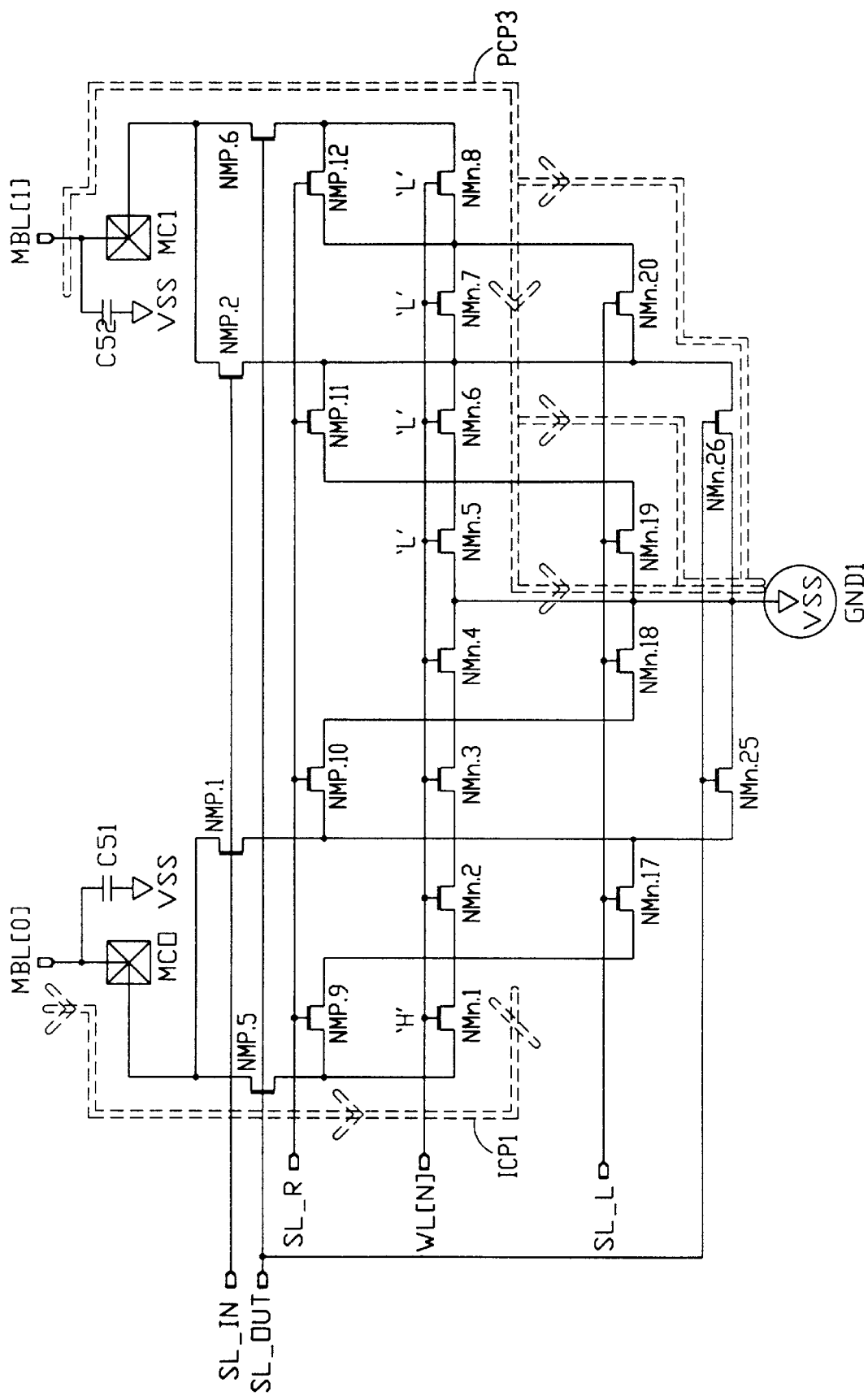
FIG. 7A is a circuit diagram illustrating a current flow path when charging a parasitic capacitance based on an off current in the circuit of FIG. 5.
Figure 7B:
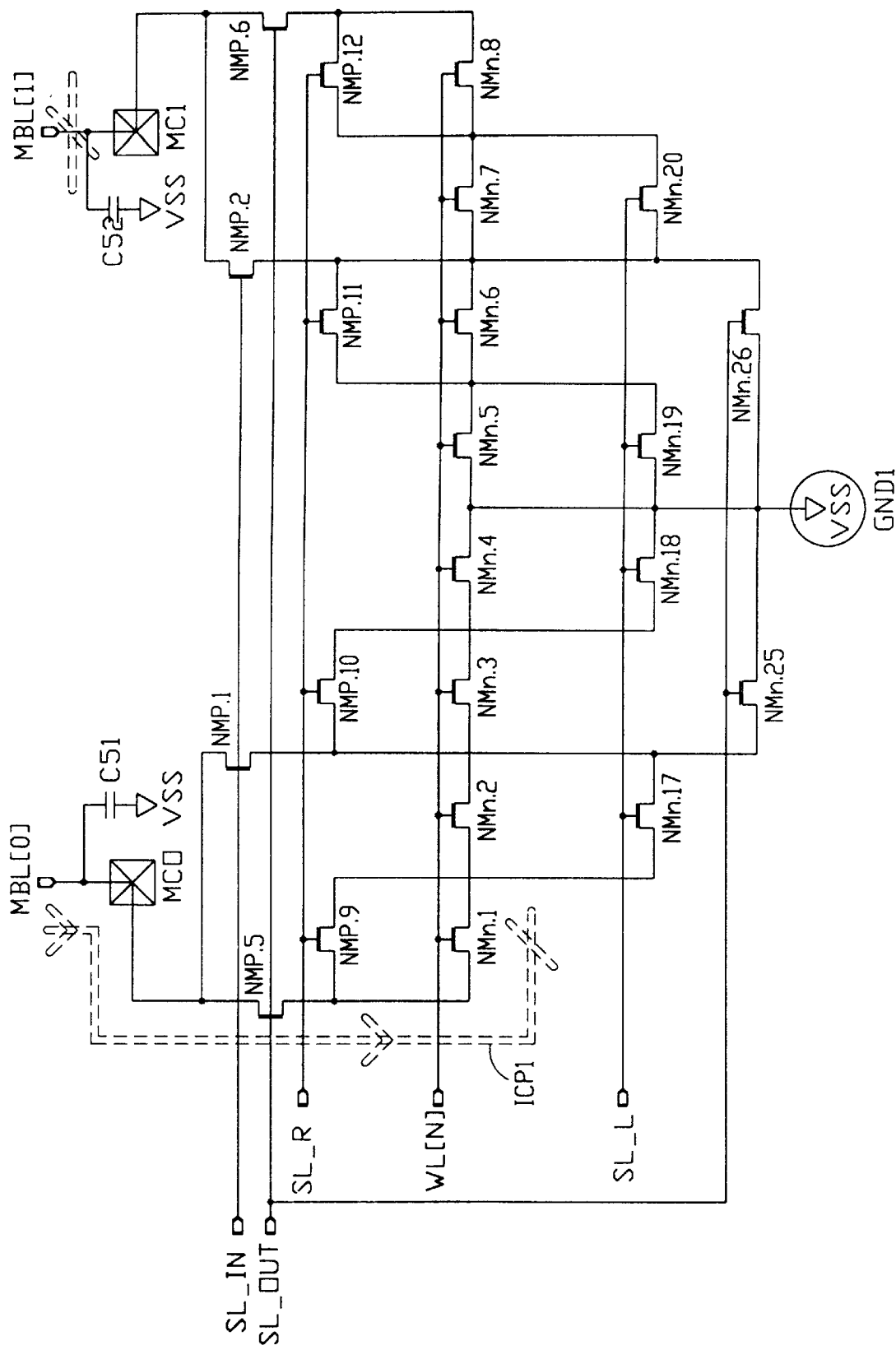
FIG. 7B is a circuit diagram illustrating a current flow path when discharging a parasitic capacitance based on an off current in the circuit of FIG. 5.

FIGS. 7A and 7B illustrate the off current flow paths according to the present invention. Here, FIG. 7A illustrates the off current flowing path when a parasitic capacitance has been charged, and FIG. 7B illustrates an off current flowing when the parasitic capacitance has been discharged. When the high level data is written into the cell $NM_{n.1}$, since the current flow path from the metal bit line MBL[0] to the fixed ground terminal GND1 is blocked by the cell $NM_{n.1}$, the off current value at the ideal current path ICP1 is zero.

Figure 6:
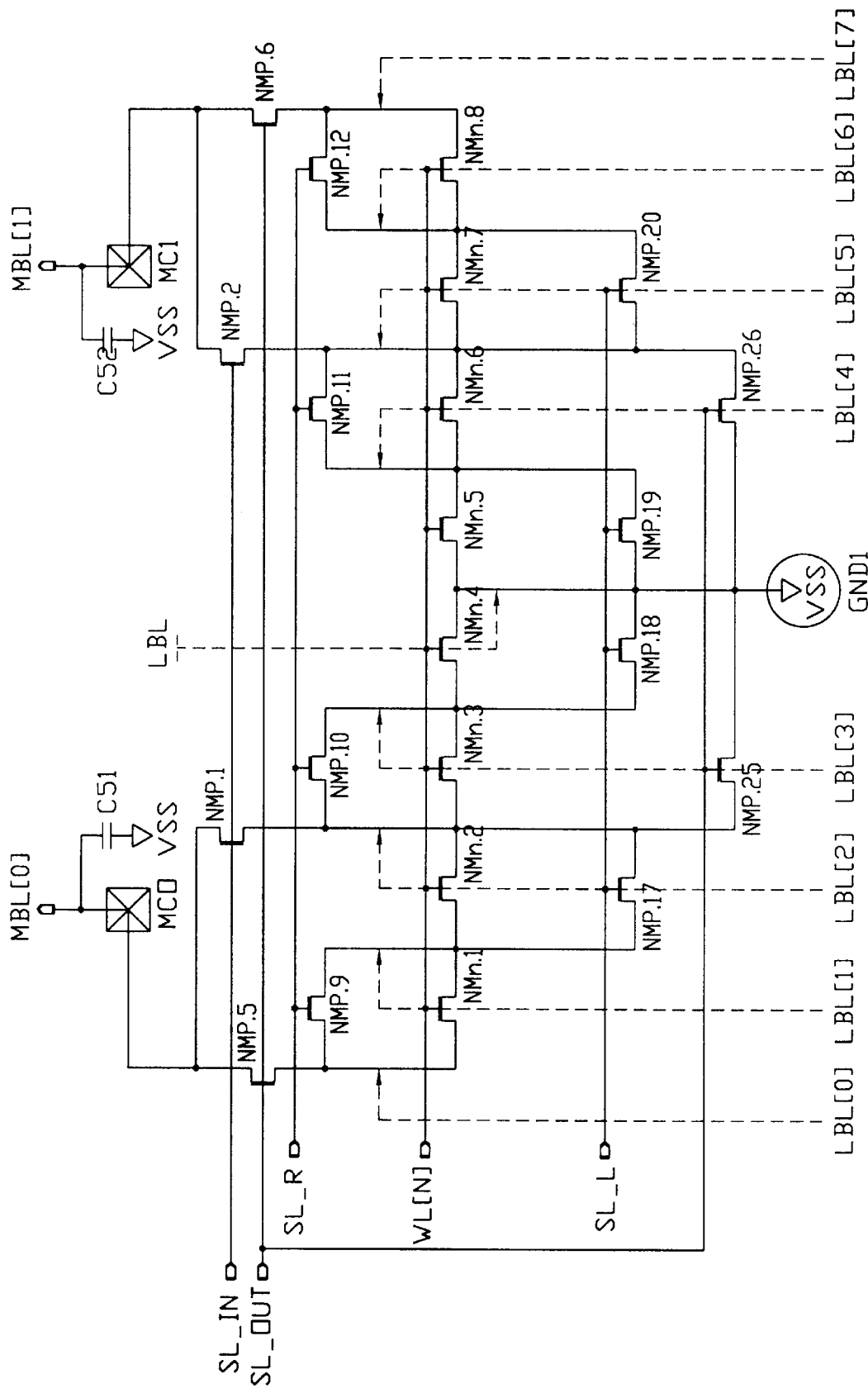
FIG. 6 is a detailed circuit diagram illustrating a memory unit.

As shown in FIG. 7A, the cell $NM_{n.1}$ is selected by the same selection sequence as in FIG. 6. In addition, when the parasitic capacitance C52 of the metal bit line MBL[1] which was not selected, is in a charging state, the condition which the maximum current is applied to the parasitic current path PCP3 is that the low level data are written into all the cells $NM_{n.5}$, $NM_{n.6}$, $NM_{n.7}$ and $NM_{n.8}$ which are connected to the word line WL[N].

Figure 1:
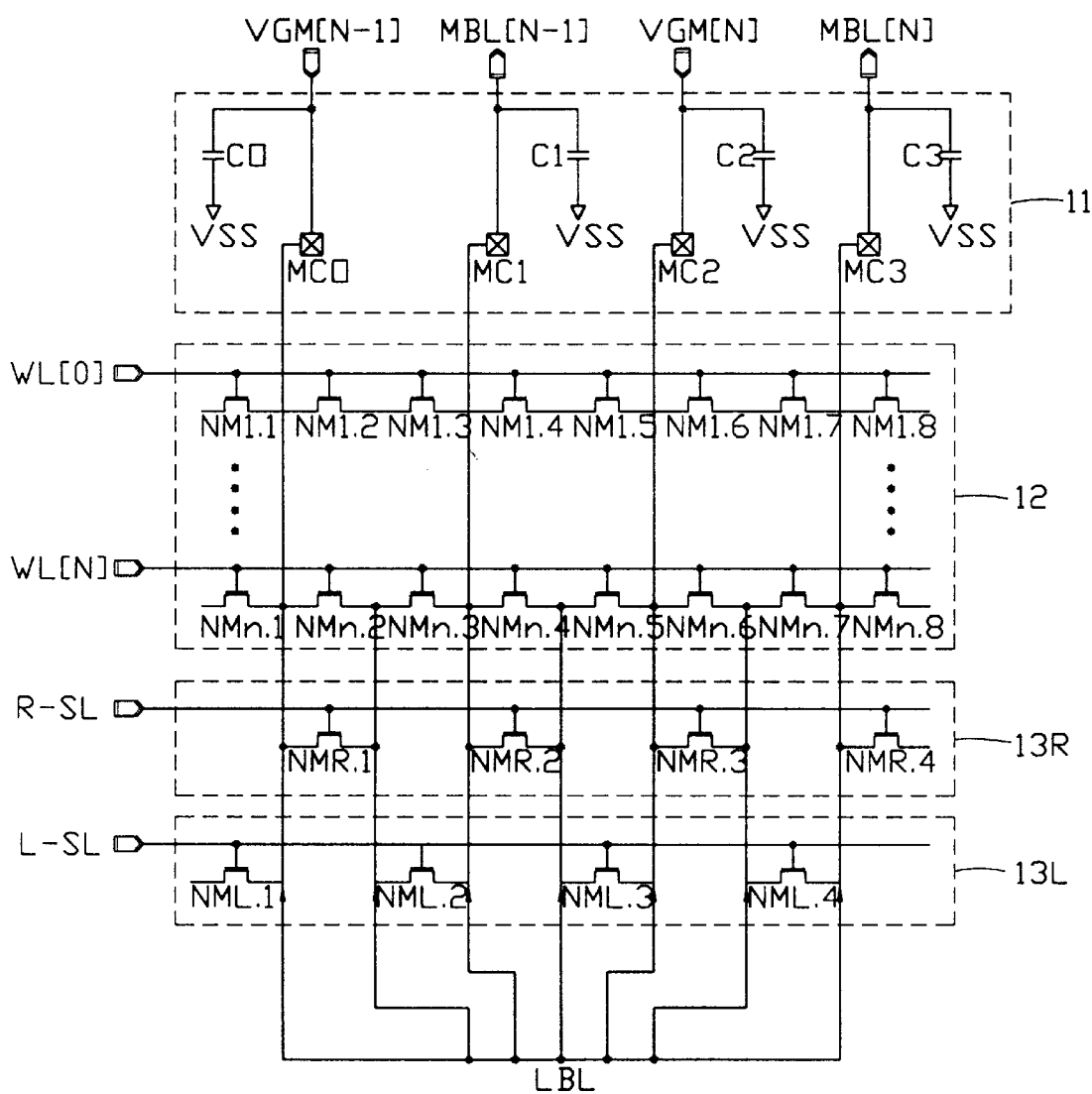
FIG. 1 is a circuit diagram illustrating a conventional flat-cell array which includes a virtual ground.
Figure 2A:
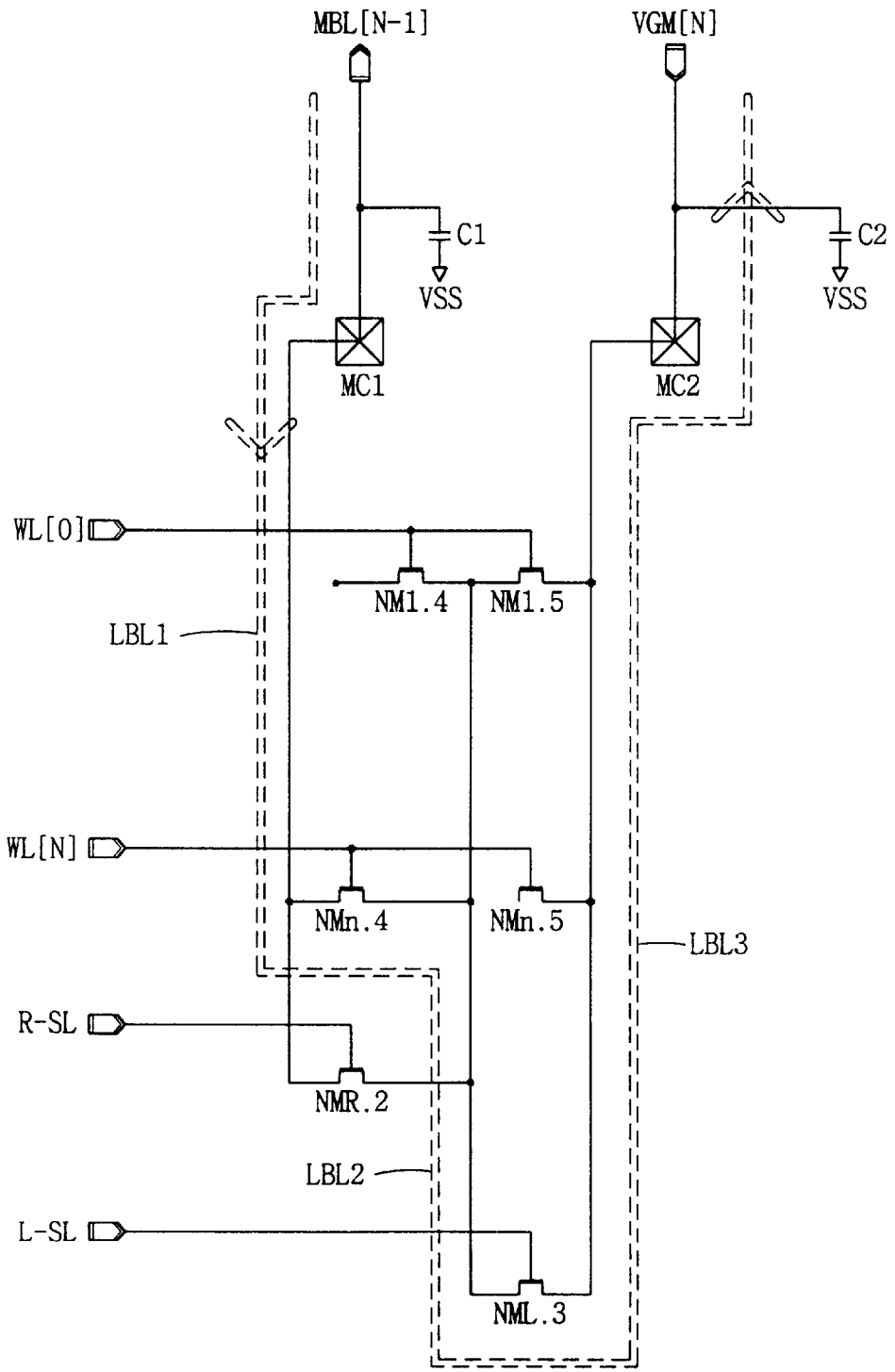
FIGS. 2A and 2B are circuit diagrams illustrating a current flow path when a predetermined cell is selected from the circuit of FIG. 1.
Figure 2B:
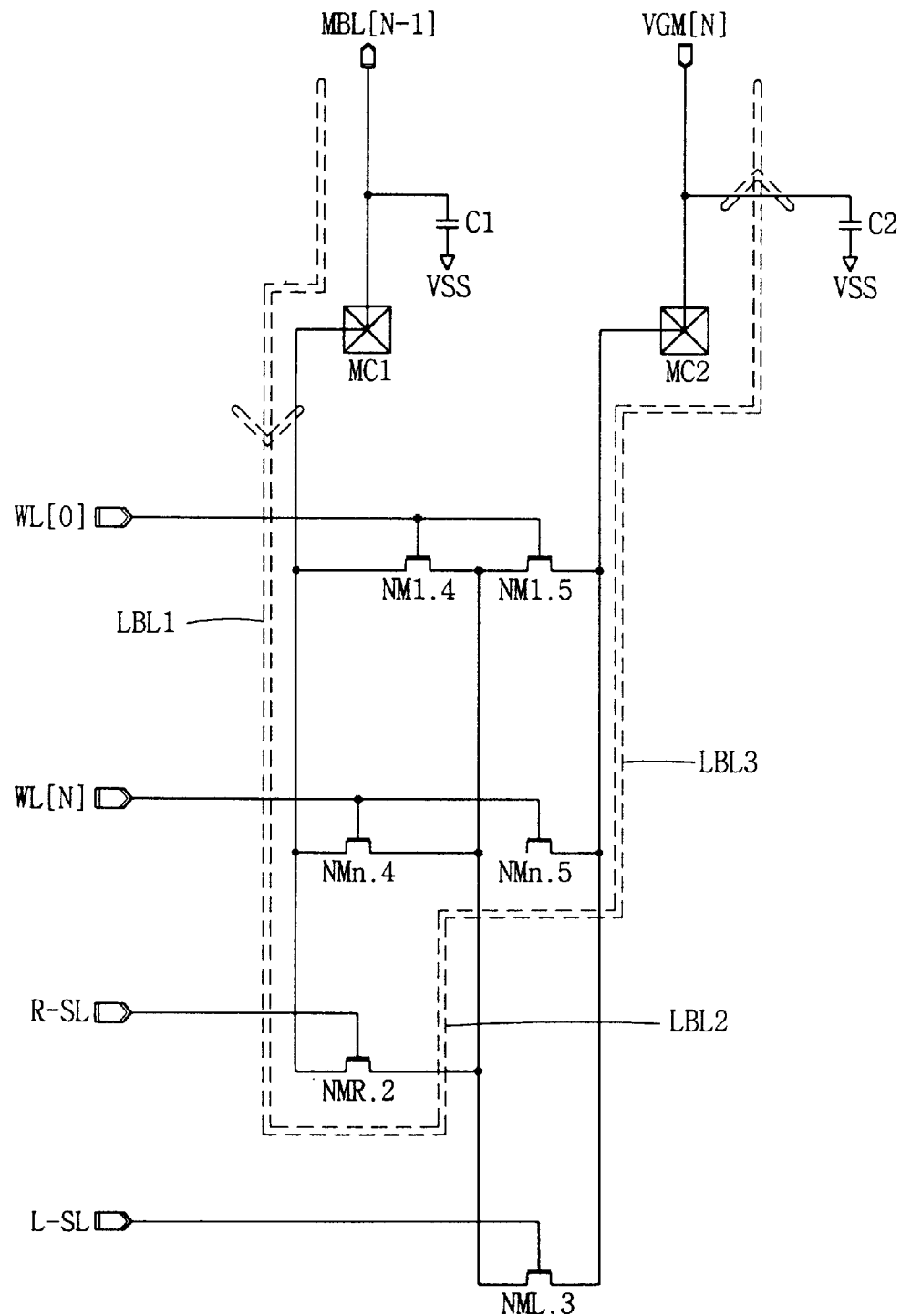
Figure 3A:
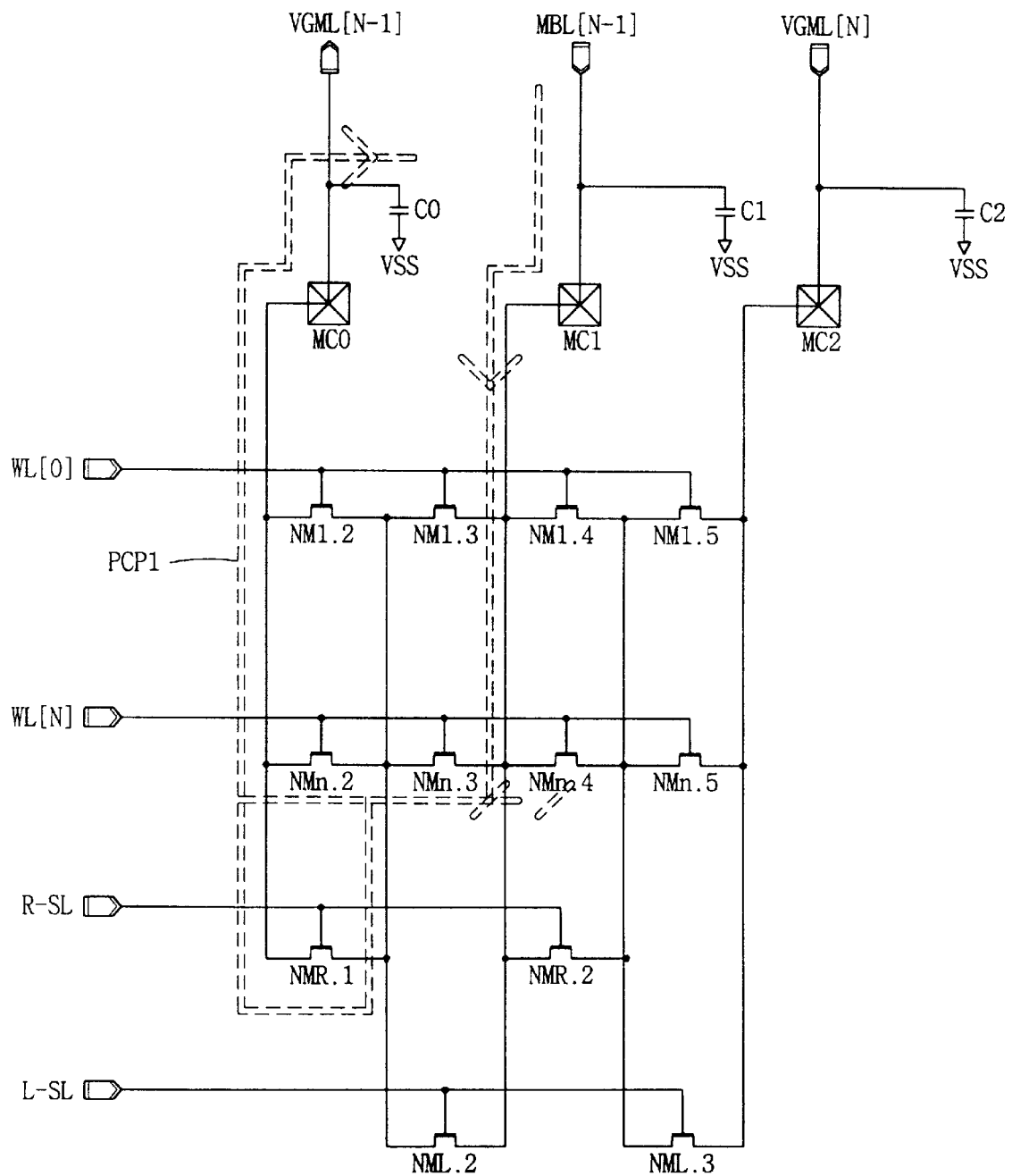
FIG. 3A is a circuit diagram illustrating an off current based on a parasitic current path in the circuit of FIG. 1.
Figure 3B:
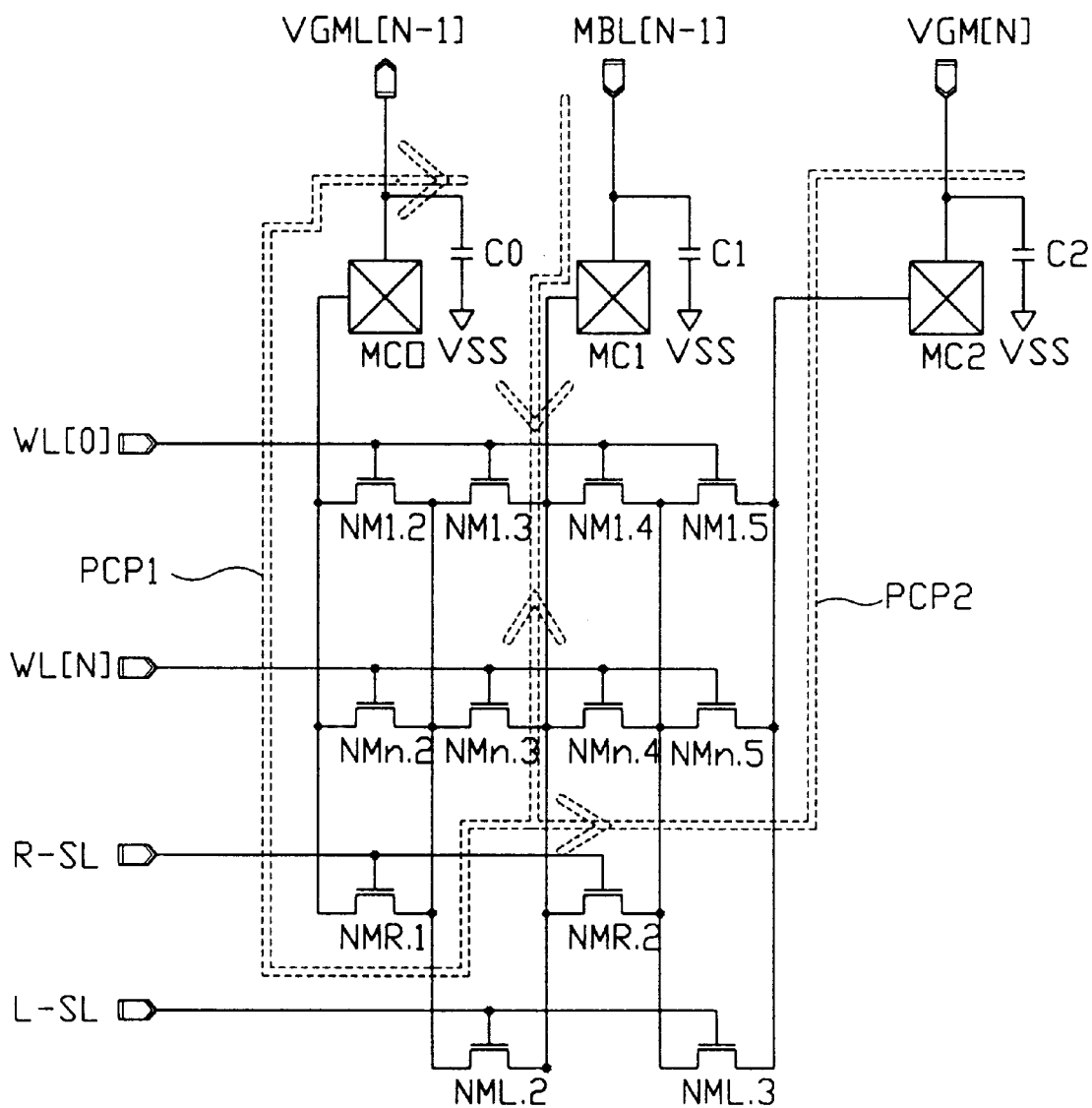
FIG. 3B is a circuit diagram illustrating an on current based on a parasitic current path in the circuit of FIG. 1.
Figure 4A:
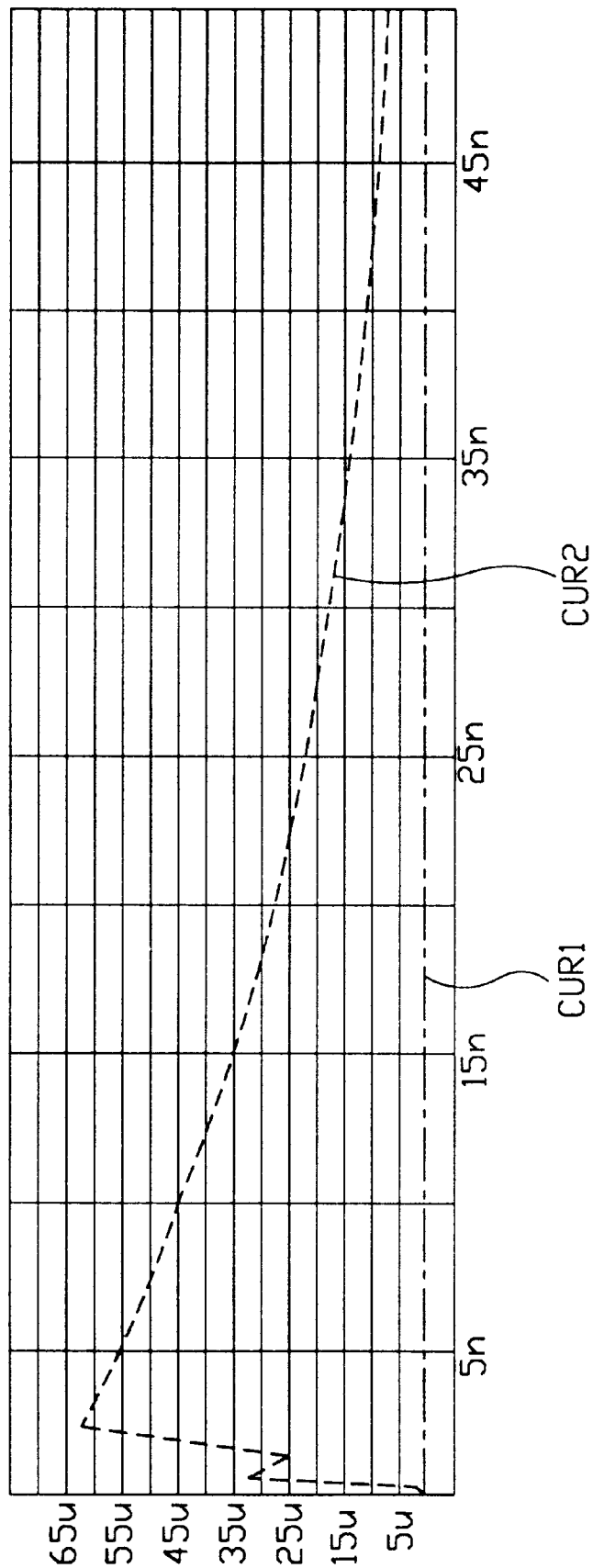
FIG. 4A is a waveform illustrating an off current from a conventional memory cell array.
Figure 4B:
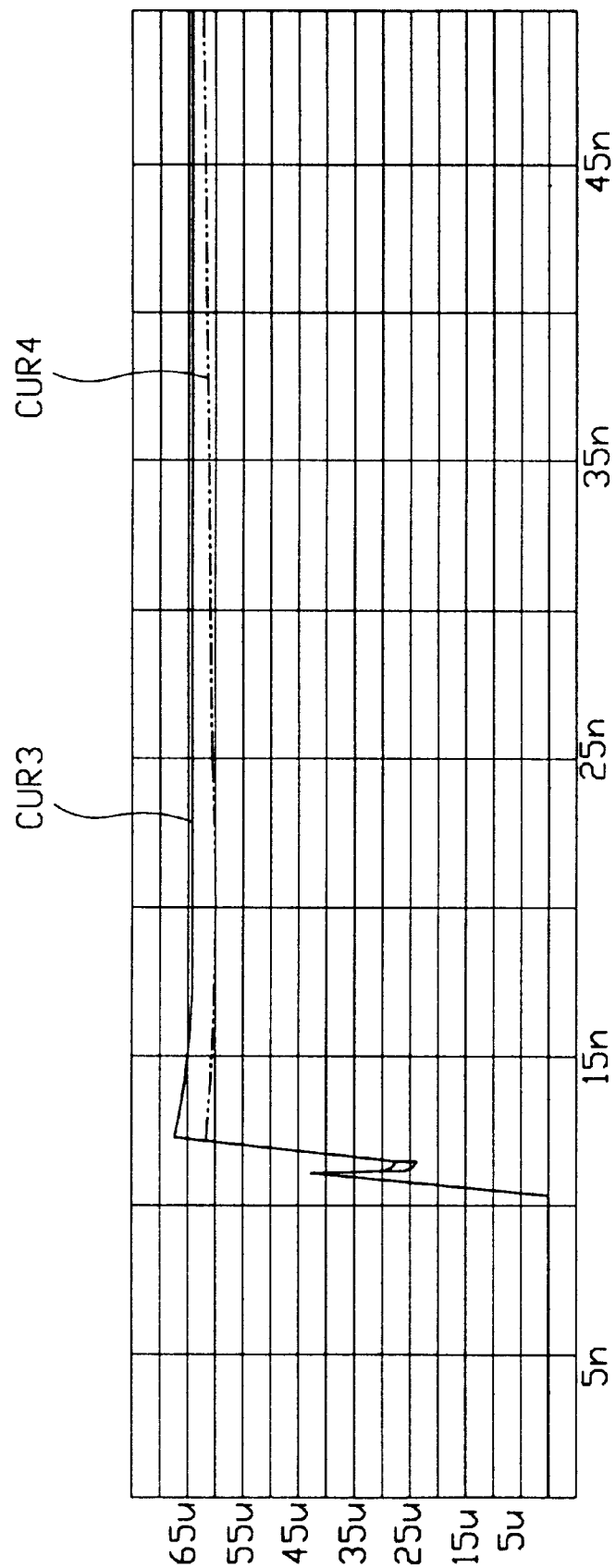
FIG. 4B is a waveform illustrating an on current from a conventional memory cell array.

However, the current flowing at the parasitic current path PCP3 does not affect the off current which flows from the metal bit line MBL[0] to the cell $NM_{n.1}$ because the parasitic current path PCP3 is connected to the fixed ground terminal GND, not to the metal bit line MBL[0]. The parasitic current path PCP1 as shown in FIG. 3A is connected with the selected metal bit line MBL[N−1], for thus increasing the off current. Namely, the above-described operation becomes more understandable by comparing the above-described operation with the operation that an ideal off current value is not made zero.

FIG. 7B illustrates an off current of the cell $NM_{n.1}$ when the parasitic capacitance C52 at the metal bit line MBL[1] is in the discharged state. At this time, since the voltage of the parasitic capacitance C52 and the fixed ground terminal GND1 have the identical level, the parasitic current path does not exist.

As described above, since the parasitic capacitance C52 formed at the metal bit lines MBL which are not selected does not affect the off current of the selected cell, when the circuit for the flat-cell array according to the present invention is applied, the off current value becomes zero which is same as the ideal off current value.

Figure 9A:
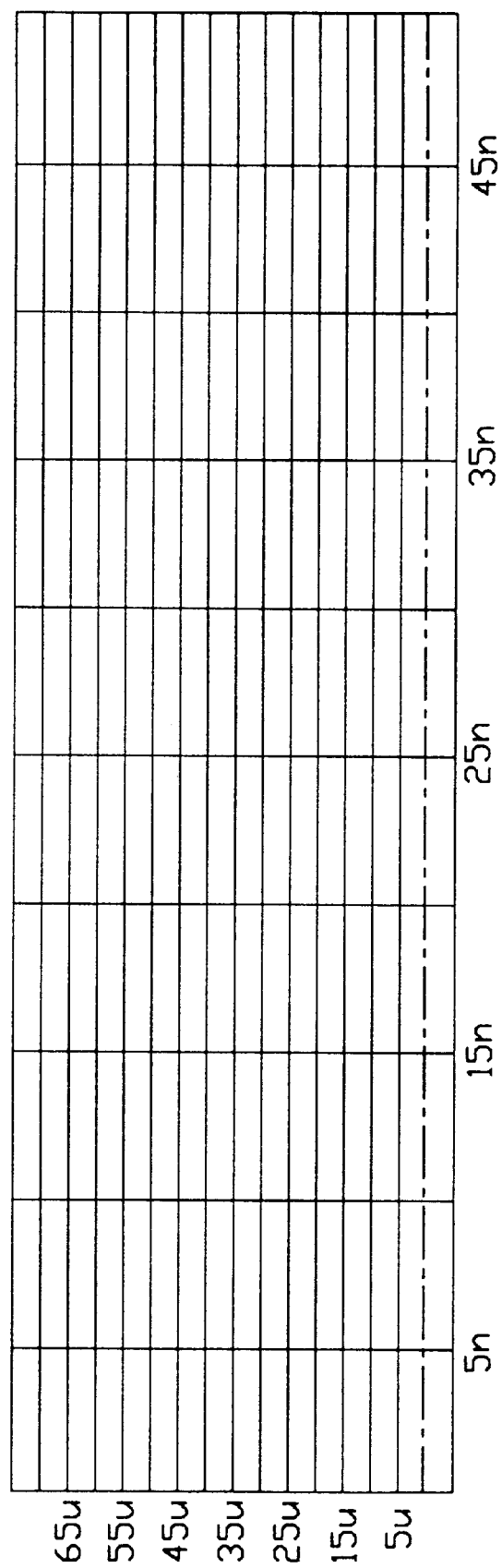
FIG. 9A is a waveform illustrating an off current of a flat-cell array according to the present invention.

FIG. 9A is a waveform illustrating an off current of a flat-cell array according to the present invention, showing that the ideal off current value and the actual off current value are identically zero.

Figure 8A:
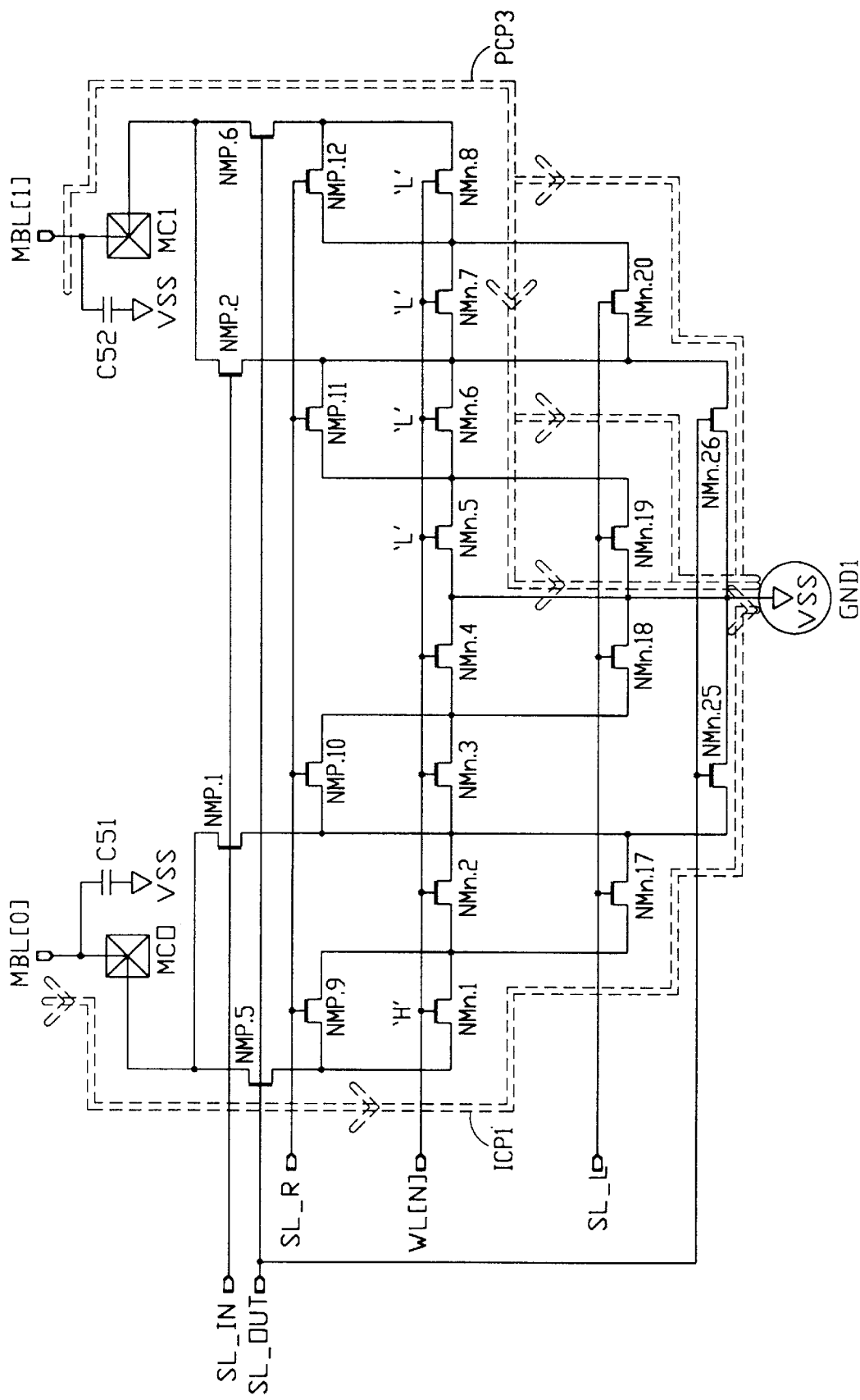
FIG. 8A is a circuit diagram illustrating a current flow path when charging a parasitic capacitance based on an on current in the circuit of FIG. 5.
Figure 8B:
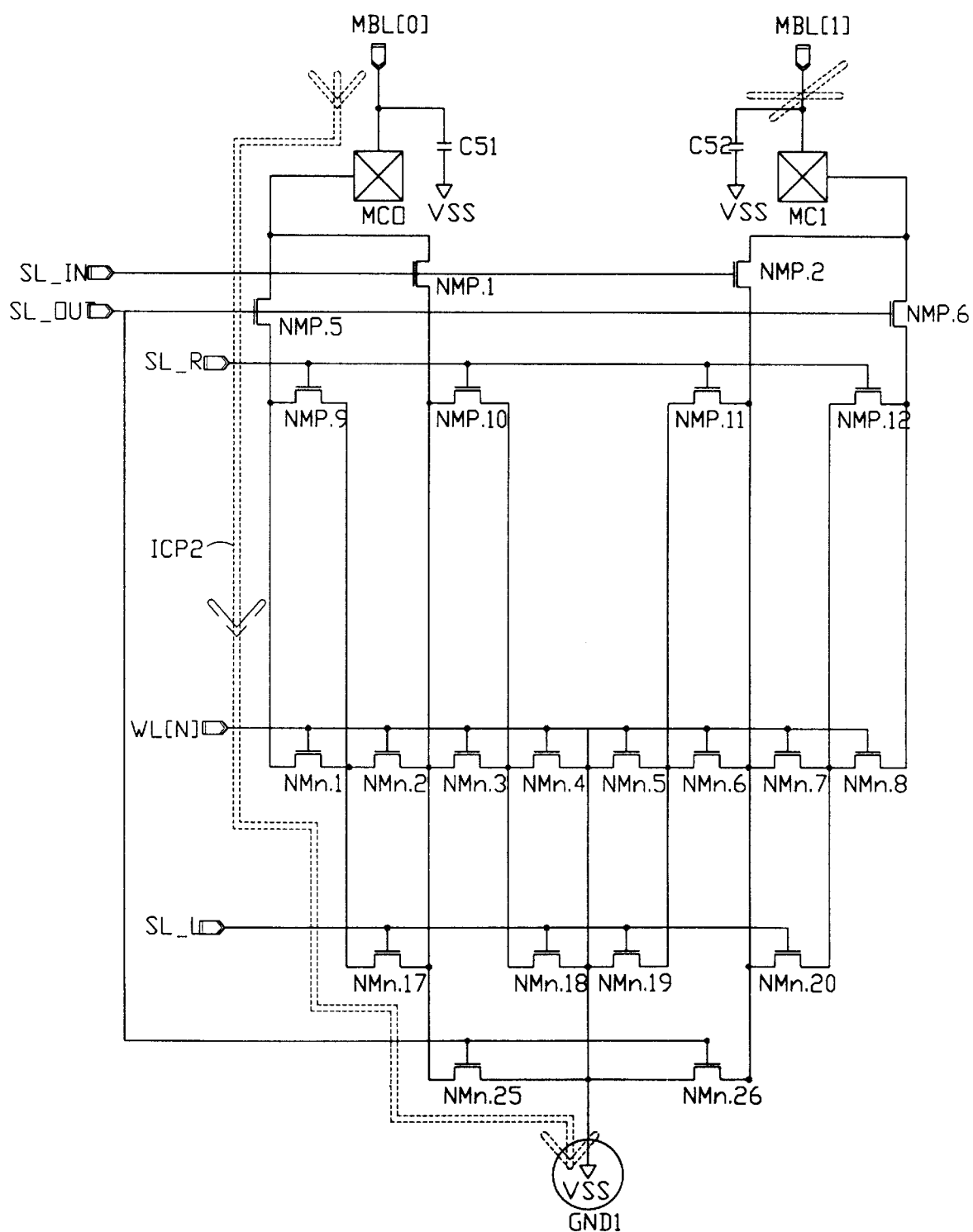
FIG. 8B is a circuit diagram illustrating a current flow path when discharging a parasitic capacitance based on an on current in the circuit of FIG. 5.

FIGS. 8A and 8B illustrate the on current flow paths according to the present invention, of which FIG. 8A illustrates an on current flow path when the parasitic capacitance C52 has been charged, and FIG. 8B illustrates an on current flow path when the parasitic capacitance C52 has been discharged.

As shown in FIG. 8A, when selecting the metal bit line MBL[0], the ideal current path ICP2 formed between the metal bit line MBL[0] and the fixed ground terminal GND1 is not affected by the parasitic current path PCP3 formed by the parasitic capacitance C52 of the non-selected metal bit line MBL[1].

The reason is that, since the fixed ground terminal GND1 is directly connected with the external ground terminal GND of the memory cell region through the metal contact MC1, the electric potentials of the ground terminals GND1 and GND are identical.

Since the fixed ground terminal GND1 is only one point at which the parasitic current path PCP3 and the ideal current path ICP2 are connected, and the electric potentials of the fixed ground terminal GND1 and the external ground terminal GND are identical, the parasitic current path PCP3 and the ideal current path ICP2 are independent electric circuits, sharing the ground terminal. The actual on current path of the cell formed by the metal bit line MBL[0] is identical to the ideal on current, namely, the current path ICP2. It means that the parasitic capacitance C52 is electrically removed.

FIG. 8B illustrates a state that the parasitic capacitance C52 of the non-selected metal bit line MBL[1] is not discharged. Namely, the parasitic capacitance C52 and the fixed ground terminal GND1 have the identical electric potential, so that a parasitic current path is not formed.

Figure 9B:
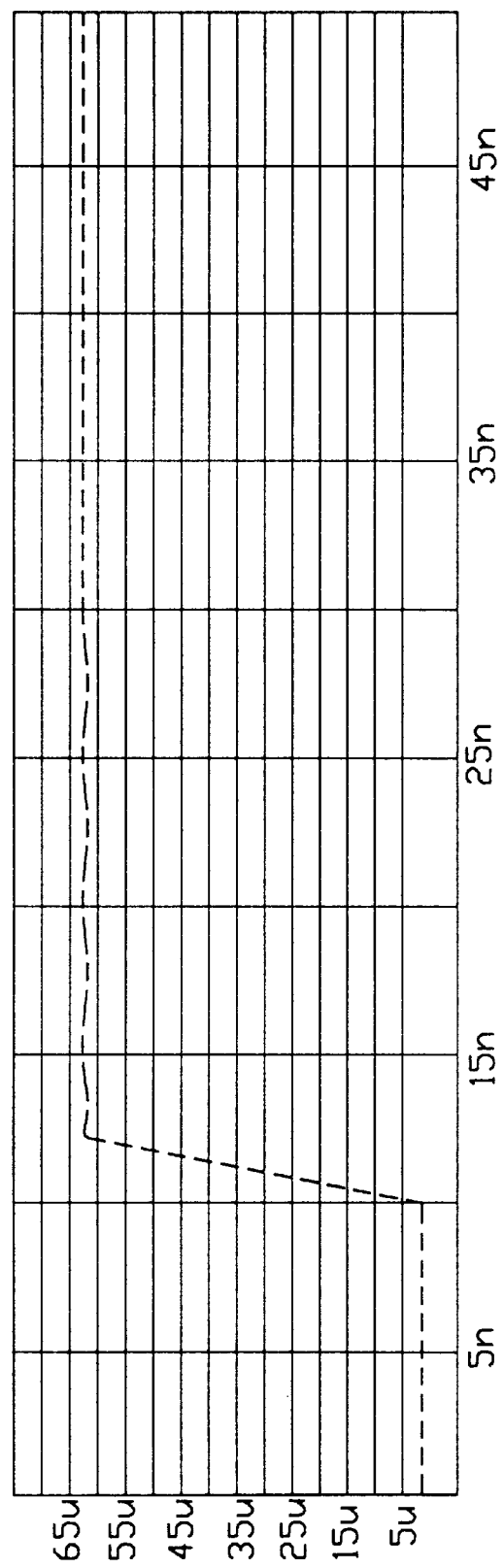
FIG. 9B is a waveform illustrating an on current of a flat-cell array according to the present invention.

As shown in FIGS. 8A and 8B, the parasitic capacitance C52 of the non-selected metal bit line MBL does not affect the on current of the cell. Actually, it means that the parasitic capacitance C52 is removed. FIG. 9B illustrates a waveform of an on current simulation result of the memory cell according to the present invention. In more detail, FIG. 9B illustrates a state that the ideal on current value and the actual on current value are identical.

As the method of selecting the cell $NM_{n.1}$, it is possible to select a cell by which the driving signals at the inner selection line SL_IN and the outer selection line SL_OUT, and the left selection line SL_L and the right selection line SL_R are properly selected, one cell among the cells $NM_{n.2}$–$NM_{n.4}$ is connected to the metal bit line MBL[0], and one cell among the cells $NM_{n.5}$–$NM_{n.8}$ is connected to the metal bit line MBL[1]. At this time, it is possible to obtain the removing effect of the parasitic capacitance which affects the on/off current ratio of the cells at the same time as the selection of the cell $NM_{n.1}$.

Since the parasitic capacitance C52 at the non-selected metal bit line MBL does not affect the off current from the selected cell, the value of the off current becomes zero as the ideal off current value. FIG. 9a illustrates a waveform of an off current simulation result of a memory cell according to the present invention. Namely, FIG. 9a illustrates that the ideal off current value and the actual off current value have zero.

Figure 10:
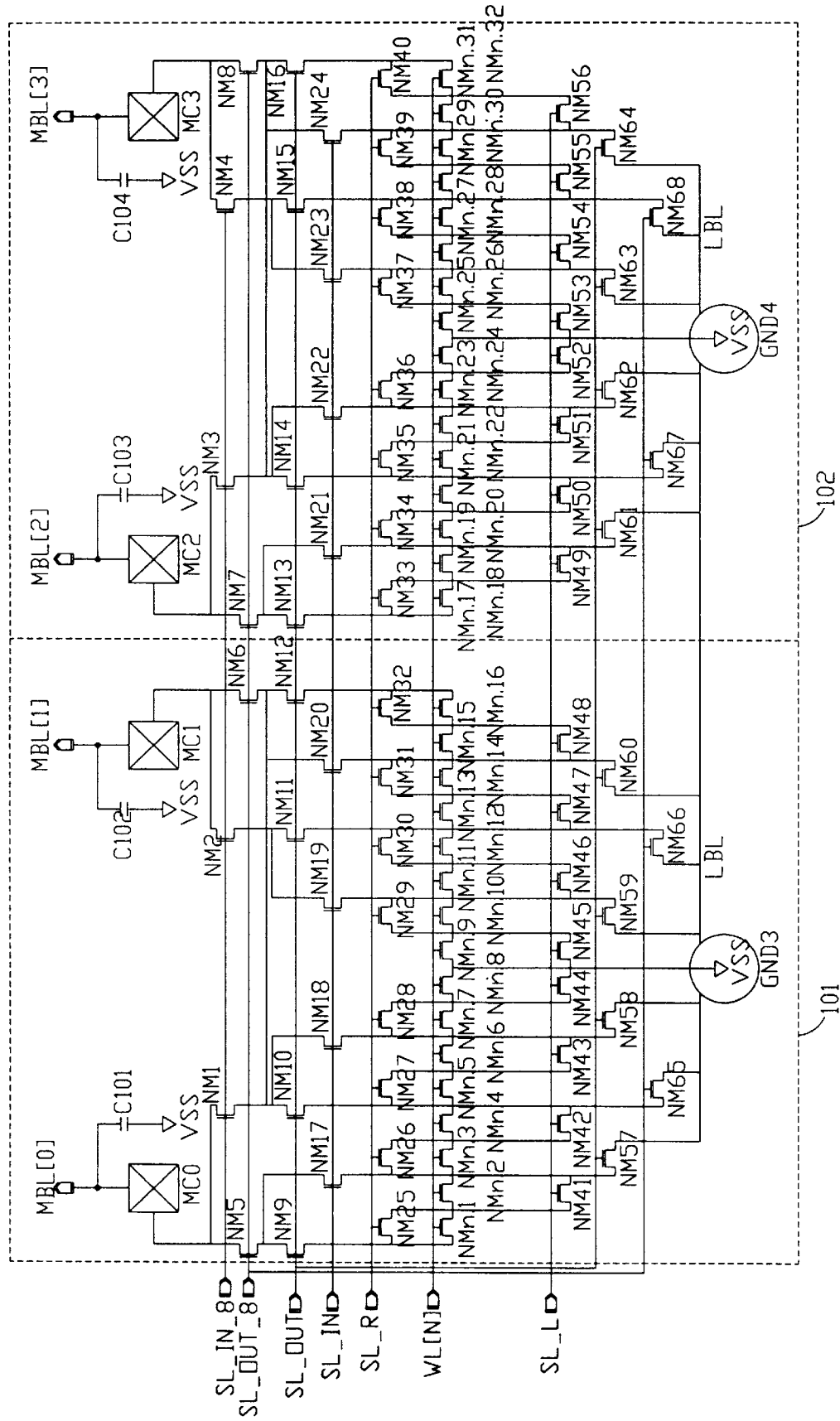
FIG. 10 is a circuit diagram illustrating an on/off current ratio improving circuit of a flat-cell array according to the present invention.

FIG. 10 illustrates the on/off current ratio current ratio improving circuit for a flat-cell array according to another embodiment of the invention. Comprising with the embodiment of FIG. 5, the different configuration is that the unit block is composed of 16 cells. Namely, a selection signal is further provided in order to select the added cell.

Here, an inner selection line SL_IN_8 and an outer selection line SL_OUT_8 are added thereto. The outer selection line SL_OUT_8 is configured to select four cells $NM_{n.1}$–$NM_{n.4}$ starting from the left side and four cells $NM_{n.13}$–$NM_{n.16}$ from the right side among 16 memory cells $NM_{n.1}$–$NM_{n.16}$ of the memory unit 101, and the inner selection line SL_IN_8 is configured to select the remaining eight cells $NM_{n.5}$–$NM_{n.12}$ therebetween.

Particularly, the outer selection line SL_OUT8 is configured to connect the metal bit lines MBL[0] and MBL[1] connected to the memory unit 101, identically to the outer selection line SL_OUT as shown in FIG. 5, to the local bit line LBL of the unit memory 101 and to connect the fixed ground terminal GND3 located in the center of the memory unit 101 to the source local bit line LBL at the sources of the cell $NM_{n.4}$ and the cell $NM_{n.13}$.

In addition, as shown in FIG. 10, the memory cell array is classified by the memory units 101 and 102, and the two metal bit lines (MBL[0] and MBM[1]) and (MBL[2] and MBM[3]) are connected to the local bit line LBL of the left and right sides. In addition, the fixed ground terminals GND3 and GND4 are located in the center of the memory units 101 and 102, the effects of the parasitic capacitance of the non-selected metal bit lines MBL are removed, and it is possible to obtain the removing effects of the parasitic capacitance of the virtual ground terminal VGND due to the fixed ground terminals GND3 and GDN4, identically to the embodiment of FIG. 5.

As described above, in the on/off current ratio improving circuit for a flat-cell array according to the present invention, the memory cell array connected to each word line is divided into a predetermined number of blocks, resulting in an insulation state with other blocks, whereby it is possible to prevent the circuit blocks. In addition, since the fixed ground terminal is used for connecting the external ground terminal of the memory cell region to the memory unit through the metal contact, it is possible to obtain a correct ground connection compared to the virtual ground connection method of connecting with an external ground terminal through the pass transistor. In addition, since the metal bit line is located in the left and right sides of the memory unit, and the parasitic capacitance at the metal bit line is blocked by the fixed ground terminal before the same is connected to the selected metal bit line, it is possible to effectively remove the parasitic capacitance. Furthermore, it is possible to maintain the off current value of the cell to have an ideal zero value by removing the parasitic capacitance, and the on current value can have a maximum value because the leakage current does not occur. As a result, the on current value of the cell becomes the maximum value, and the off current value becomes zero. Since the difference between the on current and off current is gradually increased, it is possible to reduce the sensing time, whereby it is possible to enable a high speed data reading operation, and to secure a desired on/off current of the cell by adapting to the low voltage memory.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An on/off current ratio improving circuit for a flat-cell array, comprising:
    a metal line connection unit that selectively connects an external ground terminal to a left metal bit line and a right metal bit line;
    a cell array;

an inner and outer cell selection unit that selects a cell of the cell array connected to the metal line connection unit in accordance with a first signal transmitted to inner and outer selection lines among cells of the cell array;

left and right cell selection units that select the cell from a left cell or a right cell connected between the metal line connection unit and a fixed ground terminal in accordance with second and third signals respectively transmitted to left and right selection lines among the cells of the cell array; and a word line selection unit that selects a row of the selected cell in accordance with a fourth signal, wherein the cell array is a memory unit arranged as a unit group having the fixed ground terminal and a prescribed number of cells, wherein the inner and outer cell selection unit couples one of the left and right metal bit lines to the selected cell and the other to the external ground terminal using the fixed ground terminal to reduce its parasitic capacitance to substantially zero.

2. The circuit of claim 1, further comprising a plurality of sub-memory units dependently connected to the memory unit and having the identical construction of the memory unit, wherein the fixed ground terminal electrically isolates a metal bit line connected to the selected cell in each of the plurality of sub-memory units.

3. The circuit of claim 1, wherein the number of cells of the unit group of the cell array is $2^n$, where n is an integer greater than zero, and wherein the cell array is symmetrically located centered on the fixed ground terminal.

4. The circuit of claim 1, wherein the inner and outer selection lines are symmetrically located centered on the fixed ground terminal, and wherein said fixed ground terminal is connected to a center local bit line of local bit lines connected with the left and right metal bit lines.

5. The circuit of claim 1, wherein said left metal bit line is located in a point connected to a local bit line which is first located on the basis of the leftmost side of the memory unit, and said right metal bit line is located in a point connected to a local bit line which is first located on the basis of the rightmost side thereof.

6. The circuit of claim 1, wherein the inner and outer cell selection unit comprises a first plurality of transistors driven by a first selection signal to select a pair of cells, the right cell selection unit comprises a second plurality of transistors driven by a right selection signal to select a right cell of the pair of cells, wherein the left selection unit comprises a third plurality of transistors driven by a left selection signal to select a left cell of the pair of cells, and wherein the inner and outer cell selection unit connects the selected cell to the fixed ground terminal.

7. The circuit of claim 1, wherein a plurality of bit lines corresponding to the left and right metal bit lines that form the inner and outer selection lines, the left and right selection lines and local bit lines are symmetrically positioned around the fixed ground terminal.

8. The circuit of claim 1, wherein the parasitic capacitance of the non-selected metal bit line does not effect an off-current and an on-current from the selected cell.

9. The circuit of claim 1, wherein the fixed ground terminal is directly connected to the external ground terminal, and wherein the fixed ground terminal is a single point of contact that electrically couples the left metal bit line and the right metal bit line.

10. A selection circuit for a memory device, comprising:

a memory array having a plurality of cells with a matrix form of rows and columns;

a plurality of conductive contacts to transmit data from the memory array, wherein a selected conductive contact transmits selected data from a selected cell in the memory array;

a first selection unit coupled to the memory array, the contacts and a fixed voltage terminal directly connected to an external prescribed voltage to select a pair of cells including the selected cell in a row of the memory array;

a second selection unit connected to a first set of columns in the memory array and the first selection unit; and a third selection unit connected to a second set of columns in the memory array and the first selection unit, wherein the second and third selection units select the selected cell from the pair of cells, wherein each conductive contact is a metal contact connected to a plurality of metal bit lines, wherein the external prescribed voltage is ground, and wherein the remaining conductive contacts are coupled to the ground using the fixed terminal to electrically isolate the selected contact in the memory array.

11. The selection circuit of claim 10, wherein the fixed ground terminal increases an on/off ratio of the selected cell.

12. The selection circuit of claim 10, wherein the second selection unit is a right-right cell selection unit and the third selection unit is a left cell selection unit, and wherein the first selection unit has a first part connected to the second selection unit and a second part connected to the third selection unit.

13. The selection circuit of claim 10, wherein the memory array has a plurality of memory units, wherein each memory unit comprises conductive contacts, first, second, third selection units and a fixed voltage terminal to reduce a parasitic capacitance of corresponding non-selected conductive contacts to substantially zero.

14. The selection circuit of claim 10, further comprising a word line selector that selects the row of the memory array.

15. The selection circuit of claim 10, wherein the first selection unit comprises a first plurality of transistors driven by a first selection signal, the second selection unit comprises a second plurality of transistors driven by a second selection signal to select a right cell of the pair of cells, wherein the third selection unit comprises a third plurality of transistors driven by a third selection signal to select a left cell of the pair of cells, wherein the first selection unit connects the selected cell to the fixed ground terminal, and wherein the plurality of cells is centered on the fixed voltage terminal.

16. A selection circuit for a memory device, comprising:

a memory array having a plurality of cells;

a plurality of conductive contacts to transmit data from the memory array, wherein a selected conductive contact transmits selected data from a selected cell in the memory array, wherein each conductive contact is a metal contact connected to a plurality of metal bit lines in the memory array;

an externally connected voltage terminal;

first and second selection units to form a connection path between the selected contact, the selected cell and the externally connected voltage terminal, wherein the first and second selection units connect the remaining conductive contacts to the externally connected voltage terminal to electrically isolate the selected contact in the memory array.

17. The selection circuit of claim 16, wherein the second selection unit includes a right selection unit and a left selection unit to form a first connection path between the selected contact and the first selection unit, wherein the first selection unit is to form a second connection path between the selected contact, the voltage terminal and the second selection unit, and wherein the first and second selection units select the selected cell in a row of the memory array.

18. The selection circuit of claim 16, further comprising a word line selector that selects a row of the selected cell in the memory array, wherein the first selection unit comprises a first plurality of transistors driven by a first selection signal to select cells in the row, the second selection unit comprises a second plurality of transistors driven by a second selection signal to select the selected cell of the cells selected by the first selection unit in the row, and wherein the plurality of cells is aligned on the fixed voltage terminal.

* * * * *